United States Patent
Sato

(10) Patent No.: US 7,776,442 B2
(45) Date of Patent: *Aug. 17, 2010

(54) PARTICULATE POWDER OF SILVER AND METHOD OF MANUFACTURING SAME

(75) Inventor: Kimitaka Sato, Honjo (JP)

(73) Assignee: Dowa Electronics Materials Co., Ltd., Tokyo (JP)

(*) Notice: Subject to any disclaimer, the term of this patent is extended or adjusted under 35 U.S.C. 154(b) by 281 days.

This patent is subject to a terminal disclaimer.

(21) Appl. No.: 11/883,344

(22) PCT Filed: Feb. 1, 2006

(86) PCT No.: PCT/JP2006/302098

§ 371 (c)(1),
(2), (4) Date: Jul. 31, 2007

(87) PCT Pub. No.: WO2006/082987

PCT Pub. Date: Aug. 10, 2006

(65) Prior Publication Data

US 2008/0152912 A1    Jun. 26, 2008

(30) Foreign Application Priority Data

Feb. 2, 2005  (JP) ............................. 2005-026805

(51) Int. Cl.
  *B22F 1/02*   (2006.01)
  *B05D 3/10*   (2006.01)
  *B32B 5/16*   (2006.01)
(52) U.S. Cl. .................... 428/402; 75/255; 75/710; 75/721; 427/216; 427/220; 428/403

(58) Field of Classification Search .................. 75/255, 75/392, 710, 721; 427/216, 220; 428/402, 428/403
See application file for complete search history.

(56) References Cited

U.S. PATENT DOCUMENTS 4,331,714 A * 5/1982 Tyran .......................... 427/216

(Continued)

FOREIGN PATENT DOCUMENTS

JP       11-246901        9/1999

(Continued)

OTHER PUBLICATIONS

Sigma-Aldrich, Safety Data Sheet, 2010.*

(Continued)

*Primary Examiner*—H. (Holly) T Le
(74) *Attorney, Agent, or Firm*—Clark & Brody

(57) ABSTRACT

A nanoparticle powder of silver has an average particle diameter measured by TEM observation (DTEM) of 30 nm or less, an aspect ratio of less than 1.5, an X-ray crystallite size (Dx) of 30 nm or less, a degree of single crystal grain {(DTEM)/(Dx)} of 5.0 or less, and a CV value {100×standard deviation ($\sigma$)/number average diameter (DTEM)} of less than 40%. The nanoparticle powder of silver has adhered to the particle surface thereof an organic protective agent having a molecular weight of 100 to 400. The nanoparticle powder is obtained by subjecting a silver salt to reduction treatment at a temperature of 85 to 150° C. in an alcohol having a boiling point of 85 to 150° C. and in the co-presence of an organic protective agent.

7 Claims, 1 Drawing Sheet

U.S. PATENT DOCUMENTS

| | | | |
|---|---|---|---|
| 4,463,030 A * | 7/1984 | Deffeyes et al. | 427/216 |
| 6,106,609 A * | 8/2000 | Yang et al. | 117/11 |
| 6,875,253 B2 * | 4/2005 | Daimon et al. | 75/255 |
| 7,585,349 B2 * | 9/2009 | Xia et al. | 75/371 |

FOREIGN PATENT DOCUMENTS

| | | |
|---|---|---|
| JP | 11-319538 | 11/1999 |
| JP | 2001-035255 | 2/2001 |
| JP | 2003-226901 | 8/2003 |
| JP | 2003-253311 | 9/2003 |

OTHER PUBLICATIONS

Vasan et al, Nanoscale Ag-Pd and Cu-Pd Alloys, J. Mater. Chem., 1995, 5(10), 1755-1757.*

S. Ayyappan et al., "Nanoparticles of Ag, Au, Pd, and Cu produced by alcohol reduction of the salts", J. Mater. Res., vol. 12, No. 2, Feb. 1997, pp. 398-401.

H.J. Hah et al., "Preparation of Silver Nanoparticles through Alcohol Reduction with Organoalkoxysilanes", Journal of Sol-Gel Science and Technology 26, 2003, pp. 467-471.

* cited by examiner

US 7,776,442 B2

PARTICULATE POWDER OF SILVER AND METHOD OF MANUFACTURING SAME

TECHNICAL FIELD

The present invention relates to a particulate powder of silver, particularly to a nanoparticle powder of silver that is a suitable material for forming interconnects of fine circuit patterns, especially for forming interconnects by the ink-jet method, and a method of manufacturing the powder. The particulate powder of silver of the present invention is a suitable material for forming interconnects on LSI substrates, and electrodes and interconnects of flat panel displays (FPDs), and for filling in fine trenches, via holes and contact holes. It is also suitable for use as a coloring material for automobile paints and the like. Moreover, its low impurity and toxicity levels make it useful as a carrier for adsorbing biochemical substances and the like in the fields of medical treatment, diagnostics and biotechnology.

BACKGROUND ART

When the size of solid substance particles reaches the ultrafine nanometer order (called "nanoparticles" in the following), the specific surface area of the particles becomes very great, so that, even though they are solids, their interface with a gas or liquid becomes extremely large. Their surface characteristics therefore strongly affect the properties of the solid substance.

It is known that the melting point of metal nanoparticles is dramatically reduced from that in the bulk state. In comparison with conventional micrometer-order particles, therefore, metal nanoparticles offer not only fine interconnect formation capability but also other features such as low-temperature sinter capability. Owing to the low resistance and excellent weatherability of silver nanoparticles, and also their low price compared with other noble metal nanoparticles, silver nanoparticles are seen as metal nanoparticles with particular promise as the next-generation material for fine interconnects.

Known methods of manufacturing nanometer-order particles (nanoparticles) of silver are broadly divided into vapor phase methods and liquid phase methods. Vapor phase methods are ordinarily methods that conduct deposition in a gas. Patent Document 1 describes a method of vaporizing silver in a helium or other inert gas atmosphere, under a reduced pressure of around 0.5 torr. Patent Document 2 teaches a liquid phase method for obtaining a silver colloid by reducing silver ions in an aqueous phase using an amine and transferring the obtained silver deposition phase to an organic solvent phase (polymeric dispersant). Patent Document 3 describes a method in which a reducing agent (alkali metal borohydride or ammonium borohydride) is used to reduce a silver halide in a solvent in the presence of a thiol type protective agent.

Patent Document 1: JP 2001-35255A
Patent Document 2: JP 11-319538 A
Patent Document 3: JP 2003-253311A

Problems to be Overcome by the Invention

The silver particles obtained by the vapor phase method of Patent Document 1 are 10 nm or less in diameter and have good dispersibility in solvent. However, the technology requires a special apparatus. This makes it difficult to synthesize large quantities of silver nanoparticles for industrial use. In contrast, the liquid phase method is basically suitable for large-volume synthesis but has a problem in that the metal nanoparticles in the liquid have a strong tendency to agglomerate, making it difficult to obtain a monodispersed nanoparticle powder. In most cases, citric acid is used as the dispersant when manufacturing metal nanoparticles, and the metal ion concentration in the liquid is usually very low as 10 mmole/L (0.01 mole/L) or lower. This is a barrier to its industrial application.

Although the foregoing method of Patent Document 2 achieves synthesis of stably dispersed silver nanoparticles by using a high metal ion concentration of 0.1 mole/L or greater and a high reaction mixture concentration, it suppresses agglomeration by using a polymeric dispersant having a high number average molecular weight of several tens of thousands. The use of a dispersant of high molecular weight is not a problem when the silver nanoparticles are to be used as a coloring material, but when the particles are to be used in circuit fabrication applications, a firing temperature that is equal to or higher than the polymer boiling point is required and, in addition, pores readily form in the interconnects after the firing, so that problems of high resistance and breakage arise, making the particles not altogether suitable for fine interconnect applications.

The foregoing method of Patent Document 3 conducts the reaction at a relatively high reactant concentration of 0.1 mole/L or greater and disperses the obtained silver particles of 10 nm or less using a dispersant. As a suitable dispersant, Patent Document 3 proposes a thiol type dispersant, which can be readily vaporized by low-temperature firing at the time of interconnect formation because it has a low molecular weight of around 200. However, the thiol type surfactant contains sulfur (S), and sulfur causes corrosion of interconnects and other electronic components, making it an unsuitable element for interconnect formation applications. The method is therefore not suitable for interconnect formation applications.

Therefore, an object of the present invention is to overcome such problems by providing a nanoparticle powder of silver suitable for fine interconnect formation applications, and a liquid dispersion thereof, at low cost and in large quantities. Moreover, since monodispersion of spherical silver nanoparticles of uniform diameter is preferable, another object is to provide a liquid dispersion of such silver particles.

Means for Solving the Problems

In accordance with, the present invention, which was accomplished for achieving the foregoing objects, there is provided a particulate powder of silver having an average particle diameter measured by TEM observation (DTEM) of 30 nm or less, an aspect ratio of less than 1.5, an X-ray crystallite size (Dx) of 30 nm or less, a degree of single crystal grain $\{(DTEM)/(Dx)\}$ of 5.0 or less, and a CV value $\{100\times$ standard deviation $(\sigma)$/number average diameter (DTEM)$\}$ of less than 40%, which particulate powder of silver has adhered to the surface of the particles thereof an organic protective agent (typically an amino compound, particularly a primary amine) having a molecular weight of 100 to 400. The present invention further provides a liquid dispersion of silver particles obtained by dispersing such particulate powder of silver in an organic solvent, which liquid dispersion of silver particles has an average particle diameter (D50) measured by the dynamic light-scattering method of 100 nm or less and a degree of dispersion $\{(D50)/(DTEM)\}$ of 5.0 or less. As can be seen in the photograph of FIG. 1, the silver particles of the present invention are spheres of uniform diameter. In a liquid dispersion, they are monodispersed with the individual particles spaced at regular intervals.

Further, as a method of manufacturing such a particulate powder of silver, the present invention provides a method of manufacturing a particulate powder of silver coated with an organic protective agent, wherein a silver salt (typically silver nitrate) is subjected to reduction treatment at a temperature of 85 to 150° C. in an alcohol having a boiling point of 85 to 150° C. and in the co-presence of an organic protective agent (typically an amino compound, particularly a primary amine, having a molecular weight of 100 to 400). The alcohol is desirably one or a mixture of two or more of isobutanol, n-butanol, s-butanol, and t-butanol.

The present inventor conducted numerous experiments to manufacture nanoparticle powder of silver by the liquid phase method and found it was possible to obtain a powder composed of spherical silver nanoparticles of uniform particle diameter by subjecting a silver salt to reduction treatment at a temperature of 85 to 150° C. in an alcohol having a boiling point of 85 to 150° C. (while refluxing vaporized alcohol to the liquid phase) and in the co-presence of an amino compound having a molecular weight of 100 to 400. This nanoparticle powder of silver disperses well in a dispersant because it is in a condition of having the organic protective agent adhered to its surface. It is therefore a suitable material for forming interconnects of fine circuit patterns, especially for forming interconnects by the ink-jet method.

The characteristic features of the invention particulate silver powder are explained individually below.

TEM Particle Diameter (DTEM)

The average particle diameter (DTEM) of the invention silver particles measured by TEM (transmission electron microscope) observation is 30 nm or less. It is determined by measuring the diameters of 300 discrete, non-overlapping particles observed in a 600000×TEM image and calculating the average thereof. The aspect ratio and CV value are determined from the same observational results.

Aspect Ratio

Figure 1:
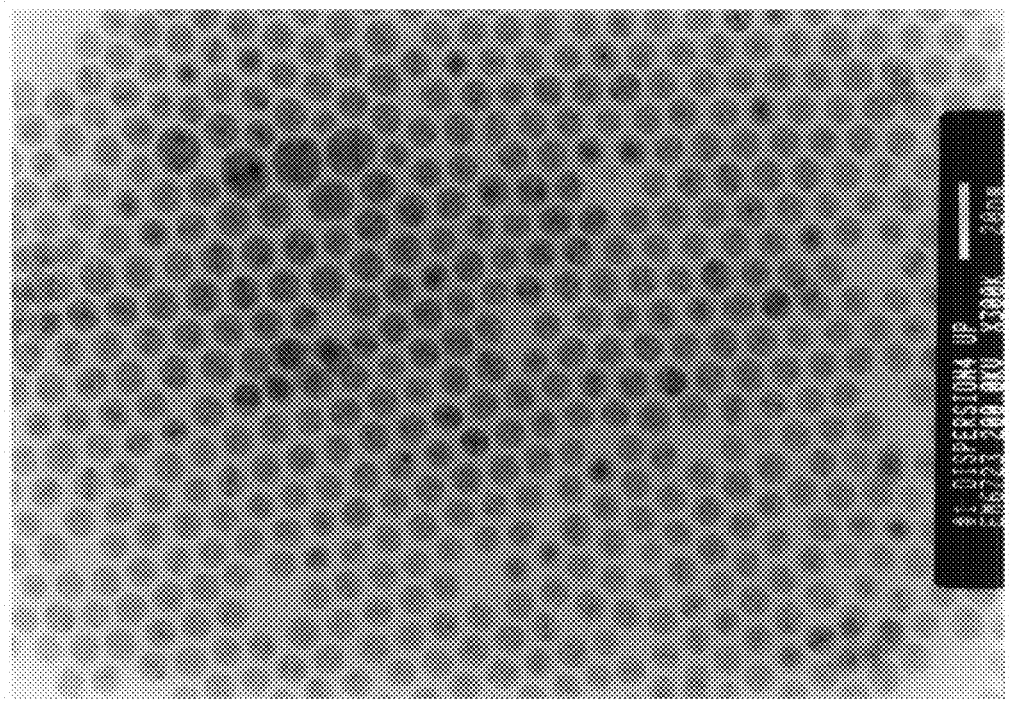
FIG. 1 is a transmission electron microscope (TEM) photograph of a nanoparticle powder of silver of the present invention.

The aspect ratio (ratio of long diameter/short diameter) of the particulate silver powder of this invention is less than 1.5, preferably less than 1.2, and more preferably less than 1.1. The particles in the photograph of FIG. 1 are substantially spherical and have an (average) aspect ratio of less than 1.05. They are therefore ideal for interconnect formation applications. If the aspect ratio exceeds 1.5, particle packing is degraded when the particle liquid dispersion is applied to a substrate and dried, which may cause pores to occur during firing, increasing the resistance and possibly giving rise to interconnect breakage.

CV Value

The CV value is an index of particle diameter variation; a smaller CV value indicates more uniform particle diameter. CV value is expressed as: CV value=100×standard deviation (σ)/number average diameter. The CV value of the particulate silver powder of the present invention is less than 40%, preferably less than 25%, more preferably 15%. A nanoparticle silver powder having a CV value of less than 40% is ideal for interconnect applications. If the CV value is 40% or greater, then, similarly to the foregoing, particle packing is inferior, so that pores occurring during firing may increase the resistance and give rise to interconnect breakage.

X-Ray Crystallite Size (Dx)

The crystallite size of the silver nanoparticles of this invention is less than 30 nm. The Scherrer relationship can be used to find the crystallite size of the particulate silver powder from the results of x-ray diffraction measurement. In this specification, the crystallite size is therefore called the X-ray crystallite size (Dx). It is determined as follows.

The Scherrer relationship is expressed by the general equation:

$$D = K \cdot \lambda / \beta \cos \theta,$$

where K is Scherrer constant, D is crystallite size, $\lambda$ is wavelength of the x-ray used for the measurement, $\beta$ is half-value width of the x-ray diffraction peak, and $\theta$ is Bragg angle of the diffraction line.

If 0.94 is used as the value of K and a Cu X-ray tube is used, the equation can be rewritten as:

$$D = 0.94 \times 1.5405 / \beta \cos \theta.$$

Degree of Single Crystal Grain

Degree of single crystal grain is represented by the ratio of TEM particle diameter to X-ray crystallite size {(DTEM)/(Dx)}. The degree of single crystal grain approximately corresponds to the number of crystals per particle. The higher the value of the degree of single crystal grain, the greater is the number of crystallites, which called the particle to be composed of multiple crystals. The degree of single crystal grain of the invention silver particles is 5.0 or less, preferably 3.0 or less, more preferably 1.0 or less. Grain boundaries within the particles are therefore few. Electrical resistance rises with increasing number of grain boundaries present. In the invention particulate silver powder, the value of the degree of single crystal grain is low, which gives it low resistance and makes it suitable for use in conductors.

Average Particle Diameter by the Dynamic Light-Scattering Method

The invention liquid dispersion obtained by mixing the particulate silver powder and the organic solvent has an average particle diameter (D50) by the dynamic light-scattering method of 60 nm or less and the degree of dispersion {(D50)/(DTEM)} is 5.0 or less.

The silver particles of this invention readily disperse in the organic solvent (dispersion medium) and can remain in a stable dispersed state in the dispersion medium. The dynamic light-scattering method can be used to assess the state of dispersion of the silver particles in the dispersion medium, and also to calculate the average particle diameter. The principle of the method is as follows. In a liquid, the translational, rotational and other forms of Brownian movement of particles having a diameter in the range of around 1 nm to 5 μm ordinarily changes the location and orientation of the particles from instant to instant. When a laser beam is projected onto the particles and the scattered light that emerges is detected, there are observed fluctuations in the scattered light intensity that are attributable to the Brownian movement. By measuring the time dependence of the scattered light intensity, it is possible to determine the velocity of the Brownian movement (diffusion coefficient) of the particles and also to learn the size of the particles. If the average diameter of the particles in the dispersion medium measured utilizing this principle is close to the average particle diameter obtained by TEM observation, this means that the particles in the liquid are individually dispersed (not attached to each other or agglomerated). In other words, the particles in the dispersion medium are spaced apart from each other and thus in a state that enables them to move independently.

The average particle diameter of the nanoparticle silver powder in the invention liquid dispersion determined by carrying out the dynamic light-scattering method thereon is on a level not much different from the average particle diameter found by TEM observation. More specifically, the average particle diameter of the invention liquid dispersion measured by the dynamic light-scattering method is 60 nm or less, preferably 30 nm or less, and more preferably 20 nm or less, which is not very different from the average particle diameter by TEM observation. This means that a monodispersed state is achieved and indicates that the present invention is capable of providing a liquid dispersion in which the nanoparticles of the silver powder are independently dispersed.

Still, even when the particles are completely monodispersed in the dispersion medium, cases arise in which measurement error or the like causes differences to arise with respect to the average particle diameter obtained by TEM observation. For example, the concentration of the liquid dispersion during the measurement must be suitable for the performance and the scattered light detection system of the measurement apparatus, and errors occur if the concentration does not ensure transmission of enough light. Moreover, the signal obtained when measuring nanometer-order particles is so feeble that contaminants and dust come to have a strong effect that may cause errors. Care is therefore necessary regarding pretreatment of samples and the cleanliness of the measurement environment. The laser beam source used for nanometer-order particle measurement should have an output power of 100 mW or greater so as to ensure adequate scattered light intensity. In addition, it is known that when the dispersion medium is adsorbed on the particles, the adsorbed dispersion medium layer has an effect that works to increase particle diameter even when the particles are completely dispersed. This effect becomes particularly manifest when particle diameter falls below 10 nm. So it can be assumed that good dispersion is maintained even if the dispersed particles do not have exactly the same degree of dispersion as the value found by the TEM observation, provided that the degree of dispersion (D50)/(DTEM) is 5.0 or less, preferably 3.0 or less.

Manufacturing Method

The particulate silver powder of the present invention can be manufactured by subjecting a silver salt to reduction treatment at a temperature of 85 to 150° C. in an alcohol having a boiling point of 85 to 150° C. and in the co-presence of an organic protective agent.

The alcohol used in the present invention as a solvent/reducing agent is required to have a boiling point of 85 to 150° C. but is not otherwise particularly limited. An alcohol having a boiling point below 85° C. does not readily enable a reaction temperature of 85° C. or higher without using a special reactor such as an autoclave. Preferred alcohols include one or a mixture of two or more of isobutanol, n-butanol, s-butanol, and t-butanol. A silver salt is used that is soluble in alcohol. Silver nitrate is preferable from the viewpoint of low price and security of supply.

As the organic protective agent, there is preferably used a metal coordination compound of a molecular weight of 100 to 400 that has coordinating capability towards silver. Use of a compound having no or only weak coordinating capability toward silver is undesirable from the viewpoint of practicability, because a large amount of protective agent would be needed to produce silver nanoparticles of 30 nm or smaller. An amino compound is suitable as the organic protective agent constituted of a metal coordination compound. Viewed generally, metal coordination compounds include isonitrile compounds, sulfur compounds, amino compounds, and fatty acids having a carboxyl group. However, a sulfur compound would degrade the reliability of electronic components because it would cause corrosion owing to the sulfur it contains. When silver nitrate is the starting material, a fatty acid or the like generates fatty acid silver and isonitrile compounds are problematic because they are toxic. This invention uses an amino compound having a molecular weight of 100 to 400 as the organic protective agent. Among amino compounds, a primary amine is preferable. A secondary amine or tertiary amine would itself operate as a reducing agent, which would cause an inconvenience in a case where an alcohol is already in use as a reducing agent, because the resulting presence of two types of reducing agent would complicate control of the reduction rate and the like. An amino compound having a molecular weight of less than 100 has low agglomeration suppressing effect. One with a molecular weight exceeding 400 has strong agglomeration suppressing effect but also has a high boiling point. If a particulate powder of silver whose particle surfaces are coated therewith should be used as a material for forming interconnects, the amino compound would act as a sinter inhibitor during firing. The resistance of the interconnects would therefore become high, possibly to the point of impairing conductivity. Since this is undesirable, it is best to use an amino compound having a molecular weight of 100-400.

At a reaction temperature under 85° C., the silver nanoparticle yield is extremely low. On the other hand, a reaction temperature exceeding 150° C. is undesirable because no additional yield improvement is observed but coarsening of the silver particles by sintering becomes pronounced. The reduction of the silver ions by alcohol is therefore best conducted with the temperature maintained between 85 and 150° C., but with the reaction being carried out while using an apparatus equipped with a reflux condenser to return vaporized alcohol to the liquid phase. The silver salt concentration of the reaction mixture is preferably made 50 mmole/L or greater. A lower concentration than this increases cost and is therefore not suitable from the industrial viewpoint.

Upon completion of the reaction, the slurry obtained is centrifuged to separate solid from liquid. The resulting sediment is added with a dispersion medium such as ethanol and dispersed therein using an ultrasonic disperser. The dispersion is again centrifuged and the sediment is again added with ethanol and dispersed with the ultrasonic disperser. This process of [solid-liquid separation→dispersion] is repeated three times, whereafter the supernatant is discarded and the sediment dried to obtain the particulate powder of silver of the present invention. As the dispersion medium (organic solvent) for dispersing the invention particulate silver powder can be used an ordinary non-polar solvent or a low-polarity solvent such as hexane, toluene, kerosene, decane, dodecane or tetradecane. The liquid dispersion obtained is then centrifuged to remove coarse particles and agglomerated particles. Next, only the supernatant is collected as a sample to be subjected to TEM, x-ray, particle size distribution and other measurements.

The nanoparticle powder obtained is dried in a vacuum drier (for 12 hours at 200° C., for example), whereafter the dry product can be assayed for silver purity using the gravimetric method (upon dissolution in nitric acid followed by addition of HCl to prepare a silver chloride precipitate) to measure purity from the weight thereof. The purity of the particulate powder of silver of the present invention is 95% or greater.

WORKING EXAMPLES

Example 1

Isobutanol (reagent grade from of Wako Pure Chemical Industries, Ltd.), 200 mL, used as a solvent/reducing agent, was added with 132.74 mL of oleyl amine (Wako Pure Chemical Industries, Ltd.) and 13.727 g of silver nitrate crystal, and the mixture was stirred with a magnetic stirrer at room temperature to dissolve the silver nitrate. The solution was transferred to a container equipped with a reflux condenser which was then placed in an oil bath. The solution was stirred with a magnetic stirrer at 200 rpm and heated while nitrogen gas used as an inert gas was blown into the container at the rate of 400 mL/min. Refluxing was continued for 5 hours at 100° C. to complete the reaction. The temperature increase rate to 100° C. was 2° C./min.

After the reaction, the slurry was subjected to solid-liquid separation and washing by the procedure set out below:
1. The slurry following the reaction was centrifuged at 5000 rpm for 60 minutes in a CF7D2 centrifuge made by Hitachi Koki Co., Ltd. to separate solid from liquid, and the supernatant was discarded.
2. The sediment was added with ethanol and dispersed using an ultrasonic disperser.
3. Steps 1 and 2 were repeated 3 times.
4. Step 1 was performed and the supernatant was discarded to obtain a sediment.

The pasty sediment obtained in Step 4 was prepared for evaluation as follows:
a) For the measurement of particle size distribution by TEM observation and dynamic light-scattering, the sediment was added with and dispersed in kerosene, the liquid dispersion was centrifuged to sediment coarse particles and agglomerated particles, and the sediment was removed to obtain a liquid dispersion. Evaluation was carried out on the liquid dispersion.
b) For the x-ray diffraction and crystallite size measurement, the liquid dispersion removed of coarse particles and agglomerated particles prepared in a) was concentrated to a paste that was coated onto a non-reflective substrate and analyzed with an x-ray diffractometer.
c) For determining Ag purity and yield, the sediment was dried in a vacuum drier for 12 hours at 200° C. and the weight of the dried product was measured. More specifically, the Ag purity of the dried product was measured by the gravimetric method (method of dissolving the dried product in nitric acid, adding HCl to the solution to prepare a silver chloride precipitate, and measuring the purity from the weight thereof). Yield was calculated as {(dried product actually obtained after reaction)/(silver amount calculated from added silver nitrate)}×100(%) per batch.

The results of the measurements were TEM average particle diameter: 6.6 nm, aspect ratio: 1.1, CV value: 10.5%, crystallite size (Dx): 8.7 nm, and degree of single crystal grain (DTEM/Dx): 0.76. Only peaks attributable to silver were observed in the x-ray diffraction results. D50 measured by the dynamic light-scattering method (Microtrack UPA) was 26.6 nm. D50/DTEM was 4.0. Silver purity was 96.8% and silver yield was 93.1%.

Figure 2:
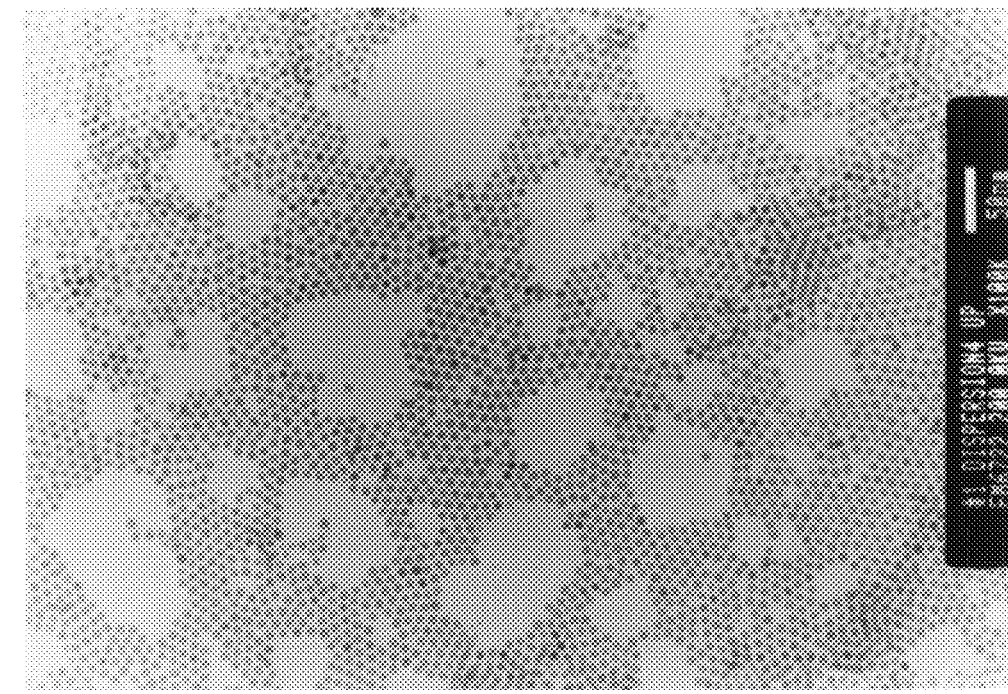
FIG. 2 is a transmission electron microscope (TEM) photograph of the nanoparticle powder of silver of the present invention taken at a different magnification from that of FIG. 1.

FIGS. 1 and 2 are TEM photographs of the nanoparticle silver powder of this Example (photographs for determining TEM average particle diameter and the like). In these photographs, spherical silver nanoparticles are observed to be well dispersed at regular intervals. Although a very small number of overlapped particles are observed, the measurements of average particle diameter (DTEM), aspect ratio and CV value were made with respect to completely dispersed particles.

Comparative Example 1

Example 1 was repeated except that propanol was used as the solvent/reducing agent and the reaction temperature was made 80° C. The results showed the silver yield to be a very low 1.1%, and while only peaks attributable to silver were observed in the sediment by x-ray diffraction, Dx was 15.9 nm. Measurements other than the x-ray diffraction analysis were impossible to carry out because the amount of sample was too small.

Comparative Example 2

Example 1 was repeated except that ethanol was used as the solvent/reducing agent and the reaction temperature was made 75° C. The results showed the silver yield to be a very low 0.9%, and while only peaks attributable to silver were observed in the sediment by x-ray diffraction, Dx was 25.4 nm. Measurements other than the x-ray diffraction analysis were impossible to carry out because the amount of sample was too small.

As can be seen from the Comparative Examples, silver yield was extremely low and productivity poor both when using an alcohol having a boiling point of 85° C. or lower and when making the reaction temperature lower than 80° C.

The invention claimed is:

1. A particulate powder of silver having an average particle diameter measured by TEM observation (DTEM) of 30 nm or less, an aspect ratio of less than 1.5, an X-ray crystallite size (Dx) of 30 nm or less, a degree of single crystal grain {(DTEM)/(Dx)} of 5.0 or less, and a CV value {100×standard deviation ($\sigma$)/number average diameter (DTEM)} of less than 40%,
   which particulate powder of silver has adhered to the particle surface thereof an organic protective agent having a molecular weight of 100 to 400.

2. The particulate powder of silver according to claim 1, wherein the organic protective agent is an amino compound.

3. A liquid dispersion of silver particles obtained by dispersing the particulate powder of silver of claim 1 in an organic solvent,
   which liquid dispersion of silver particles has an average particle diameter (D50) measured by a dynamic light-scattering method of 100 nm or less and a degree of dispersion {(D50)/(DTEM)} of 5.0 or less.

4. A method of manufacturing a particulate powder of silver coated with an organic protective agent, which comprises:
   subjecting a silver salt to reduction treatment at a temperature of 85 to 150° C. in an alcohol having a boiling point of 85 to 150° C. and in the co-presence of an organic protective agent.

5. The method of manufacturing a particulate powder of silver according to claim 4, wherein the organic protective agent is an amino compound having a molecular weight of 100 to 400.

6. The method of manufacturing a particulate powder of silver according to claim 5, wherein the alcohol is one or a mixture of two or more of isobutanol, n-butanol, s-butanol, and t-butanol.

7. The method of manufacturing a particulate powder of silver according to claim 4, wherein the alcohol is one or a mixture of two or more of isobutanol, n-butanol, s-butanol, and t-butanol.

* * * * *